United States Patent [19]
Butterbaugh et al.

[11] Patent Number: 5,630,469
[45] Date of Patent: May 20, 1997

[54] COOLING APPARATUS FOR ELECTRONIC CHIPS

[75] Inventors: Matthew A. Butterbaugh, Rochester; Donald W. Dingfelder, Winona; Peter M. Herman, Oronoco; Sukhvinder S. Kang, Rochester, all of Minn.

[73] Assignee: International Business Machines Corporation, Armonk, N.Y.

[21] Appl. No.: 501,202

[22] Filed: Jul. 11, 1995

[51] Int. Cl.[6] .................................................. F28F 7/00
[52] U.S. Cl. .......................... 165/80.3; 165/122; 165/185; 174/16.3; 257/722; 361/697
[58] Field of Search ............................ 165/80.3, 122, 165/185; 174/16.3; 361/695, 697, 691; 257/721, 722

[56] References Cited

U.S. PATENT DOCUMENTS

| | | | |
|---|---|---|---|
| 4,644,385 | 2/1987 | Nakanishi et al. | 257/719 X |
| 5,107,397 | 4/1992 | Azar | 165/80.3 X |
| 5,195,576 | 3/1993 | Hatada et al. | |
| 5,285,347 | 2/1994 | Fox et al. | |
| 5,285,350 | 2/1994 | Villaume | 165/80.3 X |
| 5,287,249 | 2/1994 | Chen | |
| 5,297,005 | 3/1994 | Gourdine | 361/697 |
| 5,335,722 | 8/1994 | Wu | |
| 5,353,863 | 10/1994 | Yu | |
| 5,368,094 | 11/1994 | Hung | |
| 5,370,178 | 12/1994 | Agonafer et al. | |

FOREIGN PATENT DOCUMENTS

| | | | |
|---|---|---|---|
| 148898 | 11/1981 | Japan | 165/80.3 |
| 153499 | 7/1986 | Japan | 165/185 |
| 94455 | 4/1991 | Japan | 257/718 |
| 95062 | 4/1993 | Japan | 257/721 |
| 102361 | 4/1993 | Japan | 257/722 |
| 160589 | 6/1993 | Japan | 361/697 |
| 186283 | 7/1994 | Japan | 361/695 |

OTHER PUBLICATIONS

Antonetti et al., "Air Jet Spot Cooling" IBM Tech. Disc. Bulletin, vol. 19, No. 12, May 1977, pp. 4688–4689.
Simons, "Micro–Modular Air–Cooling Scoop" IBM Tech. Disc. Bulletin, vol. 22, No. 1, Jun. 1979, pp. 240–241.

Primary Examiner—Leonard R. Leo
Attorney, Agent, or Firm—Philip M. Kolehmainen

[57] ABSTRACT

A circuit board mounted integrated circuit chip such as a processor is cooled by apparatus including a heat sink, a shroud and a fan. The heat sink includes a base placed on the top surface of the chip and fins extending up from the base. The shroud includes top and two opposed side walls closely enclosing the heat sink. The shroud is attached directly to the circuit board rather than to the heat sink or chip and can be used with chips and heat sinks that do not have special provision for attachment of the shroud. The fan moves cooling air through the shroud and between and around the heat sink fins. The fan is mounted to an end of the shroud and does not require clearance above the heat sink and shroud.

5 Claims, 3 Drawing Sheets

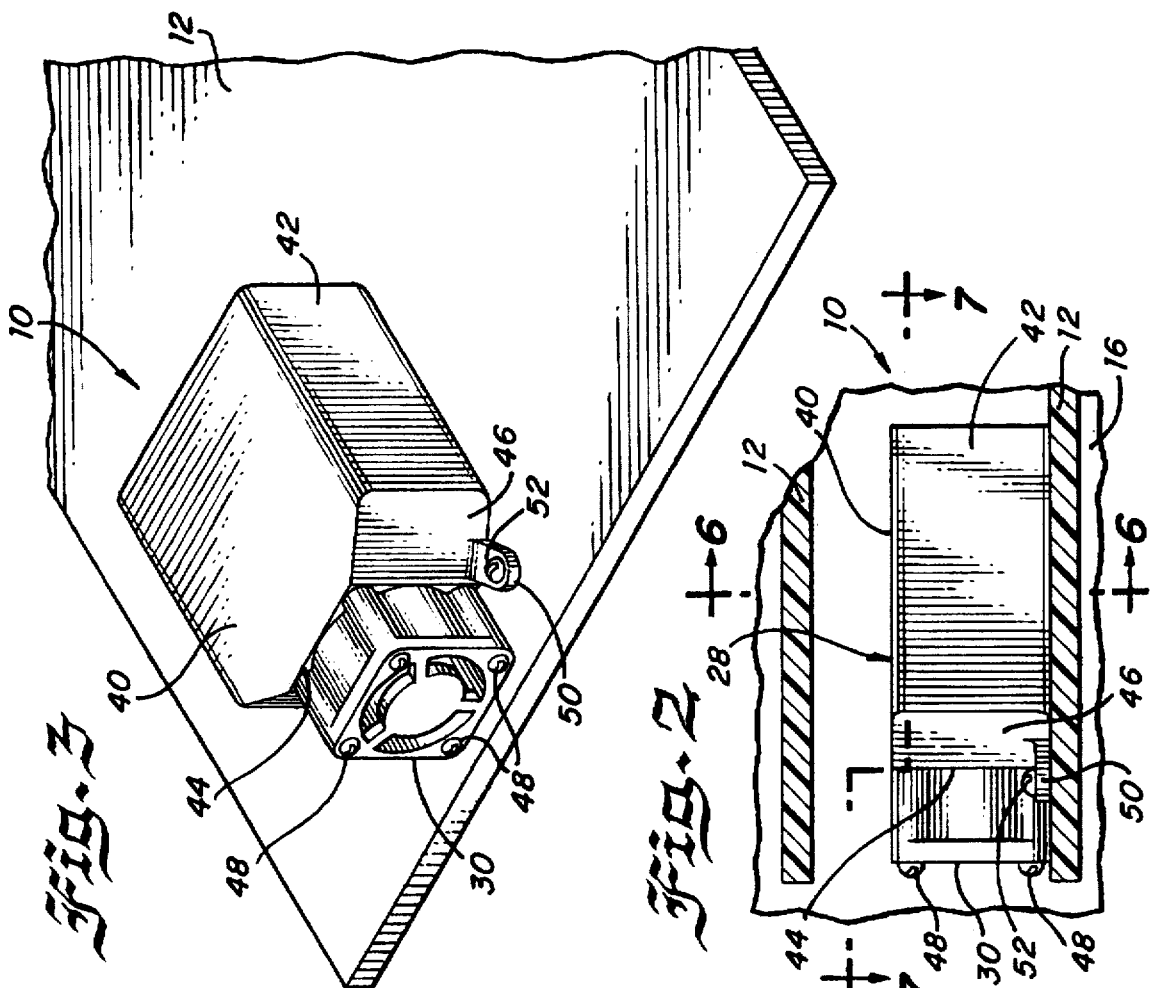
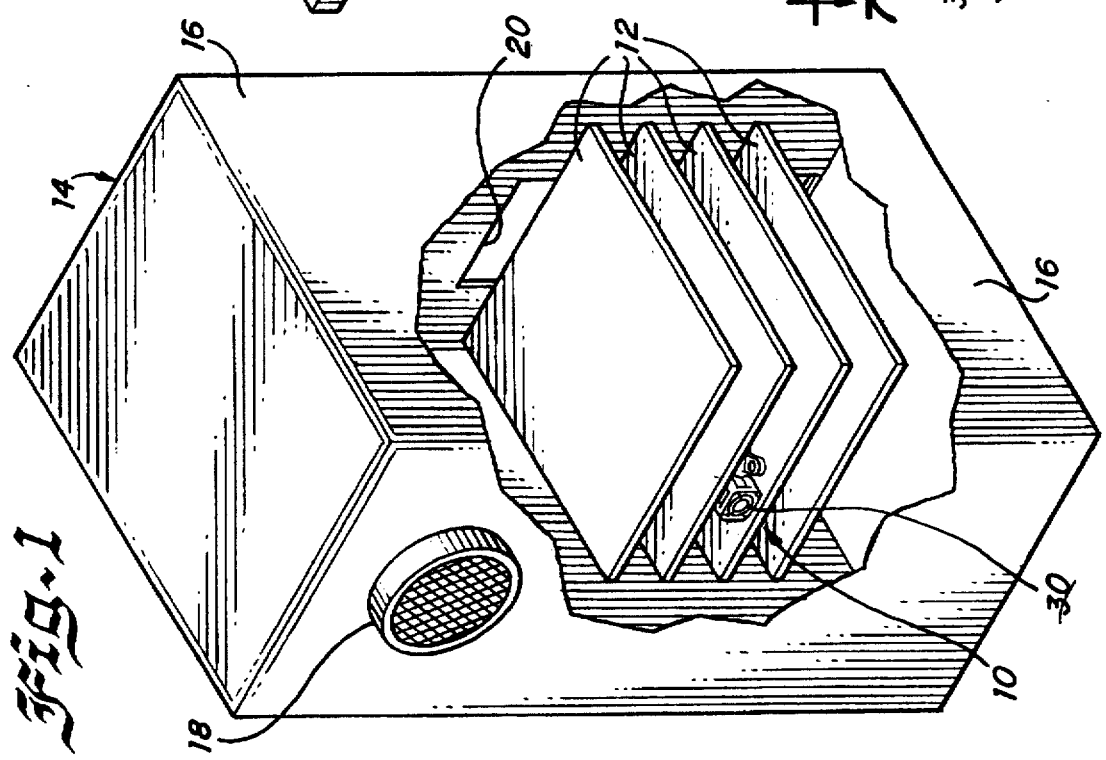

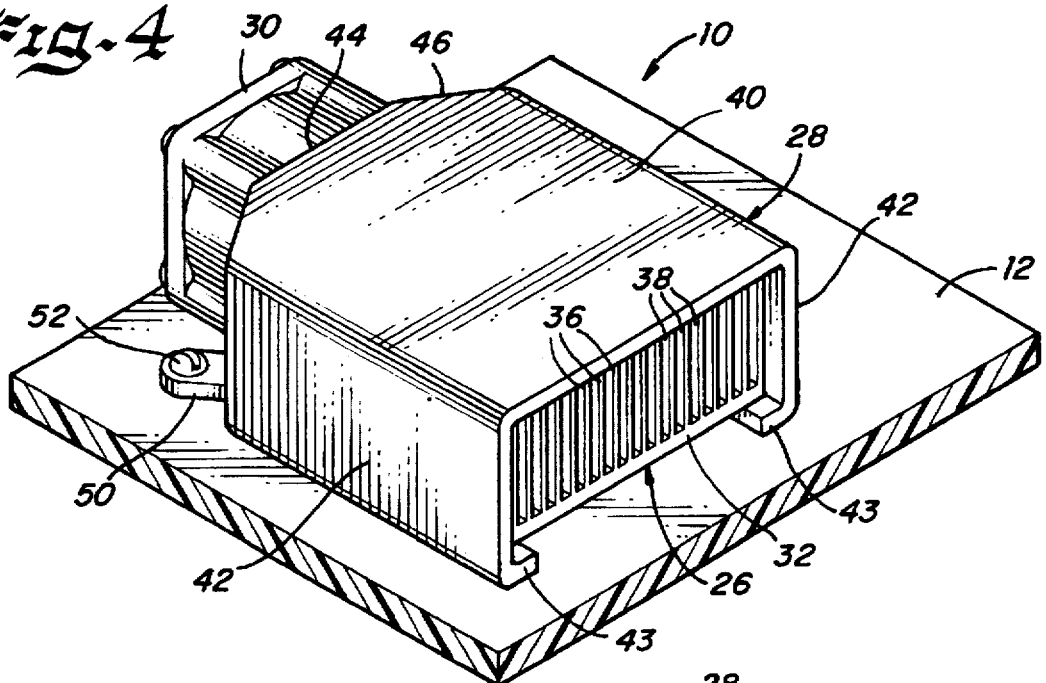
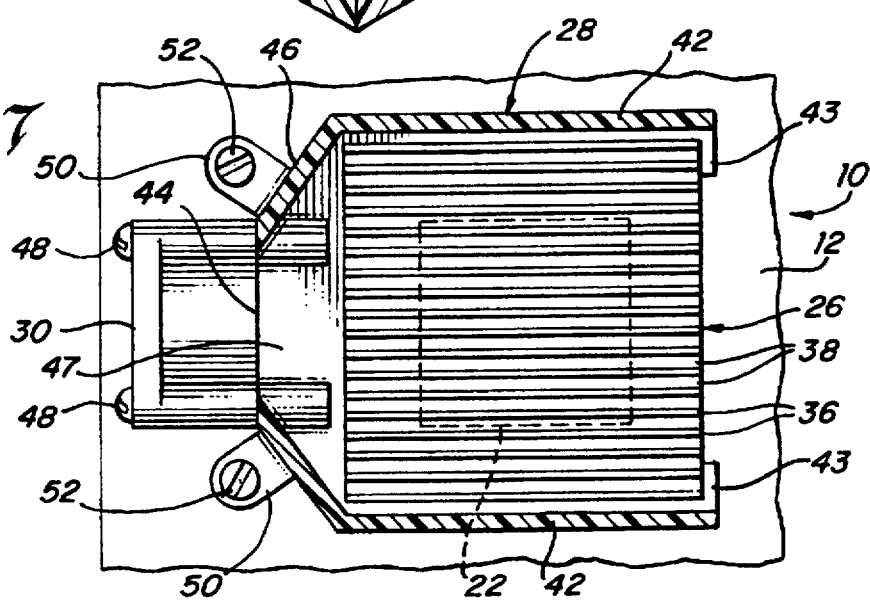
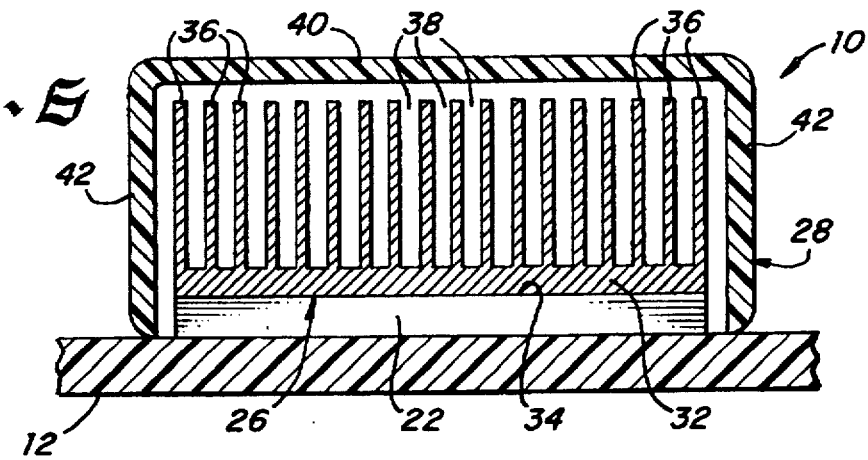

COOLING APPARATUS FOR ELECTRONIC CHIPS

FIELD OF THE INVENTION

The present invention relates to the cooling of circuit board mounted electronic chips such as high speed processors for computers.

DESCRIPTION OF THE PRIOR ART

Large scale integrated circuit chips such as processors used in modern computers include numerous circuits and operate at high speed. Such electronic chips produce heat that must be removed from the chip to prevent undesirable temperature increases.

A typical computer includes a case with a fan and vent system for moving a cooling air flow through the case. A processor chip mounted in the case may be cooled by this air flow. In order to increase the transfer of heat from the chip to the flow of air, heat sinks are used. Typical heat sinks have fins to increase surface area and transfer of heat from the heat sink.

Because the air flow through the case is insufficient for adequate cooling of electronic chips in many computer systems, a fan may be mounted upon the heat sink to increase the air flow across the fin surfaces. Known arrangements of this type have disadvantages. One problem is that a fan may not fit in the limited space available above the chip and heat sink in a restricted air flow channel. Another disadvantage is that the fan may move air in opposition to the flow of cooling air through the case and interfere with cooling of other components. A further difficulty with many known arrangements is that cooling efficiency is reduced due to blockage of fan flow or due to bypass or recirculation of heated air through the fan.

U.S. Pat. No. 5,195,576 discloses cooling apparatus including a heat sink for LSI or computer chips using thin wire fins. Air is moved through the computer case by a fan, and in one alternative air flow arrangement, a guide plate can be used to cause the flowing air to collide with the fins.

In the cooling assemblies of U.S. Pat. Nos. 5,287,249, 5,335,722 and 5,368,094, a finned heat sink is mounted upon the top surface of an integrated circuit chip and a fan is mounted directly above the heat sink. In U.S. Pat. No. 5,335,722 a hollow housing encloses the chip, heat sink and fan.

U.S. Pat. No. 5,353,863 discloses a cooling device for a processor including a heat sink or radiating flange mounted to the top of the processor and a fan mounted at the end of the heat sink. The heat sink blocks a substantial portion of the fan air flow, and air can flow away from the top of the heat sink, reducing cooling performance.

U.S. Pat. No. 5,370,178 discloses a cooling module that can be mounted on a circuit board having electronic chip devices. The module includes a heat sink base that conducts heat from the chips and fins from which heat is radiated. A shroud having cooling fans at its ends is attached to the heat sink base.

SUMMARY OF THE INVENTION

A principal object of the present invention is to provide an improved apparatus for cooling a computer processor or other integrated circuit chip. Other objects are to provide an improved chip cooling apparatus that does not require significant vertical clearance and can be used in restricted air flow passages; to provide an apparatus that maximizes cooling efficiency; and to provide a cooling apparatus that can be used with a variety of chips and heat sinks without requiring the chips or heat sinks to have special provision for the cooling apparatus. Another object is to overcome disadvantages of known apparatus for cooling integrated circuit chips.

In brief, in accordance with the invention, apparatus is provided for cooling an integrated circuit chip, the chip being mounted on a circuit board and having a heat sink upon its top surface. A shroud covers the heat sink and defines an air flow duct extending across the heat sink. The shroud is attached directly to the circuit board. A fan is mounted on the shroud for moving air through the duct.

BRIEF DESCRIPTION OF THE DRAWING

The present invention together with the above and other objects and advantages may best be understood from the following detailed description of the preferred embodiments of the invention illustrated in the drawings, wherein:

FIG. 1 is a diagrammatic, isometric illustration of a computer having a circuit board mounted electronic chip provided with a cooling apparatus in accordance with the present invention;

FIG. 2 is a fragmentary, side elevational view on an enlarged scale of a portion of FIG. 1 showing an adjacent pair of circuit boards with the electronic chip and cooling apparatus;

FIG. 3 is an isometric view showing the front of the cooling apparatus in place with a board mounted electronic chip;

FIG. 4 is an isometric view showing the back of the cooling apparatus in place with a board mounted electronic chip;

FIG. 6 is a sectional view on an enlarged scale taken along the line 6—6 of FIG. 2; and FIG. 7 is a plan view partly in section taken along the line 7—7 of FIG. 2.

DETAILED DESCRIPTION OF THE PREFERRED EMBODIMENTS

Figure 5:
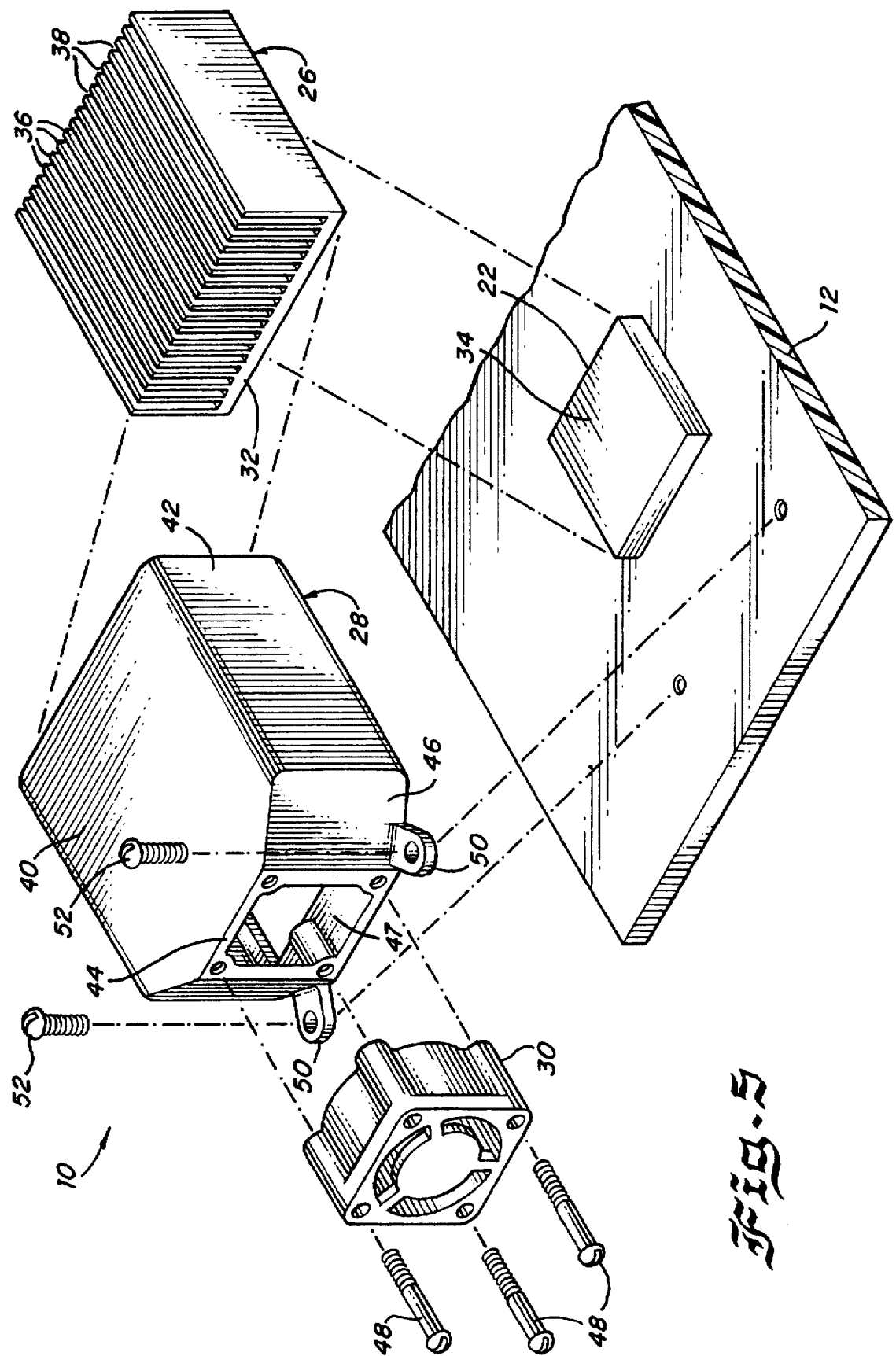
FIG. 5 is an isometric exploded view showing components of the cooling apparatus.

Having reference now to the drawings, there is illustrated an integrated chip cooling apparatus generally designated as 10 constructed in accordance with the principles of the present invention. In FIG. 1 the apparatus 10 is shown installed on one of a number of stacked, spaced apart circuit boards 12 in a computer 14. As is conventional, the computer 14 has a case or enclosure 16 with a system fan 18 mounted at one wall of the case 16 and a vent 20 in a different wall of the case 16. The system fan 18 and vent 20 provide a flow of cooling air through the case 16. Some of this cooling air moves between the boards 12 and is intended to remove heat from electronic components mounted on the boards 12.

A processor chip 22 is mounted on one of the boards 12. In the illustrated arrangement, the processor 22 is a large scale or very large scale integrated circuit chip functioning as the central processing unit for the computer 14. The principles of the present invention may be applied to cooling apparatus for many different types of electronic chips.

Chip 22 is a high power processor including many circuits operating at a high system speed. As a result, the flow of air provided by the system fan 18 and vent 20 is insufficient for adequate cooling of the chip 22. In addition, the relatively close spacing of the boards 14 limits the space available around the chip 22 to such an extent that many known chip cooling schemes cannot be used. The apparatus 10 of the present invention boosts the flow of air for cooling the chip 22 and is able to cool the chip 22 in the restricted space available.

The apparatus 10 includes a heat sink 26, a shroud 28 and a fan 30. These components are arranged and combined to maximize the efficient cooling of the chip 22 without requiring substantial vertical clearance and without interfering with the flow of system cooling air to other components of the computer 14.

Heat sink 26 includes a flat, planar base 32 that preferably generally at least corresponds in size and shape with the top surface 34 of the chip 22. Base may be larger than the top surface of chip 22 (FIGS. 5 and 7) or may be generally the same size as the chip (FIG. 6). The base 32 is placed on the top surface 34 of the chip 22 in good heat transfer relationship. Preferably the heat sink is secured with a thermally conductive adhesive such as LOCTITE 384 available from Loctite Corp. of Hartford, Conn. The heat sink 26 could be secured in heat transfer relation to the chip 22 in other ways if desired.

In order to increase the surface area of the heat sink 26 and the quantity of heat that can be transferred from the heat sink, a number of fins 36 extend upward from the base 32. In the illustrated apparatus, the fins 36 are thin, generally rectangular plates that are parallel to one another, defining an interstice or space 38 between each adjacent pair of fins 36. The interstices 38 are flat and planar vertically oriented regions and are parallel, extending in the same direction. The base 32 and fins 36 may be made of a thermally conductive metal such as aluminum. The heat sink 26 may be unitary, formed from one piece of material, or may be made by attaching discrete fins 36 to the base 32 by brazing or the like, or may be made by adhering a folded fin structure to the base 32.

The shroud 28 can be made of metal or plastic and provides a duct or passage for flow of cooling air through and around the heat sink 26. The shroud 28 includes a top wall 40 and a pair of opposed side walls 42. If base 32 is larger than the chip 22, side walls 42 can have inturned bottom edges 43 to slidingly receive the edges of base 32 (FIG. 4). The walls 40 and 42 closely enclose the heat sink 26. The side walls 42 extend in the same direction as the fins 36 of the heat sink 26. As seen best in FIG. 6, the top wall 40 is spaced a small distance from the tops of the fins 36 and the side walls 42 are spaced a small distance from the outermost fins 36. Preferably the spacing of walls 40 and 42 from the fins 36 is generally equal to the spacing between fins 36.

The fan 30 is mounted on the shroud 28 and moves cooling air through the interstices 38 and around and over the fins 36 in order to remove heat from the heat sink 26. The shroud 28 directs the entire fan flow through and around the heat sink 26 and prevents any bypass or recirculation flow losses. A portion of the cross sectional area through which air flows is blocked by the fins 36 as seen best in FIG. 6. The number and size of the fins 36 are selected in order to maximize cooling efficiency. Increasing the number of fins increases surface area but increases the blockage of cooling air flow. Best results are obtained if about one-third of the air flow is blocked by the fins 36, but satisfactory results are obtained if the blocked portion is in the range of about twenty percent to about fifty percent.

In the preferred embodiment, the base 32 is three millimeters thick, and the fins 36 are each one millimeter thick. The space 38 between fins as well as the spacing of walls 40 and 42 from the heat sink 26 is two millimeters. The fins 36 are nineteen millimeters high and the total heat sink height is twenty-two millimeters. Depending upon available space and system requirements, other dimensions may be used.

The shroud 28 includes a fan mount frame portion 44 located at a downstream, air outlet end of the shroud. A transition air guide section 46 of increasing cross sectional area extends between the frame portion 44 and the top and side walls 40 and 42. As seen in FIG. 7, the interior of the transition section 46 is clear and unobstructed to encourage smooth flow of cooling air between the heat sink 26 and the fan 30. The transition section 46 includes a bottom wall 47 (FIG. 5) extending from the frame portion portion 44 to the base 32 of the heat sink 26 for assuring that the entire air flow travels through and around the heat sink 26. The upstream, air inlet end 48 of the shroud 28 is open and unobstructed, providing no impediment to cooling air flow into the shroud 28. If desired the fan could be mounted at the inlet of the shroud 28 to push air through the shroud rather than pulling air through the shroud as in the illustrated arrangement.

Fan 30 is secured to the mounting frame 44 with fasteners 48. This permits the fan to be removed for replacement or repair. The fan is preferably small enough that it does not project vertically above the top wall 40 of the shroud 28. This has the advantage that no added vertical clearance is required for the fan 30 and the apparatus can fit in a narrow air flow channel with insufficient room for a top mounted fan, as seen in FIG. 2. Preferably a fan having a width (height as seen in the drawings) of thirty millimeters is used, such as a SUNON KD1203PFS2 fan available from EME Fan & Motor, Inc. of Mission Viejo, Calif. or a CANNON CF30-T11N1D fan available from Cannon, U.S.A.

The shroud 28 has no bottom wall in the region of the chip 22, permitting the shroud to be installed over a heat sink 26 and chip 22 that are in place on the circuit board 12. The shroud 28 includes mounting feet 50 that are attached to the circuit board 12 by fasteners 52. Because the shroud 28 is mounted directly to the circuit board 12 rather than to the heat sink 26 or chip 22, it is not necessary for the heat sink or chip to have any special structure or provision for receiving or supporting or mating with the shroud 28. This provides desirable flexibility in the use of the apparatus 10 and the design of computer systems in which the apparatus 10 may be used.

One advantage is that a shroud 28 can be designed and adapted to fit over and cool a chip having a standard heat sink of a type or from a source preferred by the computer manufacturer without modification. Another advantage is that the cooling apparatus of the present invention can be added to previously designed computer systems, even those having narrow cooling air channels.

The air flow direction of the apparatus 10 is preferably aligned with the direction of system cooling air flow in the computer 14. As seen in FIG. 1, the fan 30 pulls air through the shroud 28 and is directed downstream, in alignment with flow from the vent 20 to the system fan 18. Thus the system air flow is undisturbed, and the apparatus 10 does not impede the flow of cooling air to other components of the computer 14.

While the present invention has been described with reference to the details of the embodiments of the invention shown in the drawing, these details are not intended to limit the scope of the invention as claimed in the appended claims.

What is claimed is:

1. Apparatus for cooling an integrated circuit chip mounted on a circuit board, said apparatus comprising:

a heat sink having a base mounted in heat transfer relation upon the top of the chip;

said heat sink including spaced apart fins extending upwardly from said base, said fins defining air flow interstices generally extending in a given direction parallel to said base, said fins being parallel to one another and separated from one another by a given generally constant distance so that said interstices are of generally uniform width;

an outermost pair of said fins defining lateral side surfaces of said heat sink;

the tops of said fins lying in a generally flat plane defining an upper heat sink surface;

a shroud covering the chip and said heat sink;

means including at least one fastener for mechanically attaching said shroud in a fixed position directly to the circuit board;

said shroud having a flat, planar top wall parallel with the circuit board and overlying said heat sink and an opposed pair of side walls extending in said given direction, said side walls flanking the chip and said heat sink, said side walls extending from said top wall to the surface of the circuit board, said shroud having opposed air inlet and air outlet ends;

said shroud top wall being parallel to said upper heat sink surface and spaced from said upper heat sink surface by a distance substantially equal to said given distance and said shroud side walls being parallel to said heat sink lateral side surfaces and spaced from said heat sink lateral side surfaces by a distance substantially equal to said given distance; and a fan attached to one of said ends for moving air through said interstices, the other of said ends opposite to said fan being unobstructed defining an air flow opening at least equal in width and height to the width and height of said heat sink; and said fan extending above the surface of the circuit board a distance equal to or less than the distance between the surface of the board and said shroud top wall.

2. Apparatus for cooling as claimed in claim 1, said fan being mounted at said air outlet end.

3. Apparatus for cooling as claimed in claim 1, further comprising means for releasably securing said fan to said shroud.

4. Apparatus for cooling as claimed in claim 1, said shroud including an air guide transition section between said fan and said top and side walls, the interior of said transition section being clear and unobstructed, and said fins blocking a portion of the cross sectional area of the air flow path through and around said heat sink within said duct, said block portion being between about twenty and about fifty percent of the cross sectional area.

5. Apparatus for cooling as claimed in claim 4, said blocked portion being about one-third of the cross sectional area.

* * * * *

UNITED STATES PATENT AND TRADEMARK OFFICE
CERTIFICATE OF CORRECTION

PATENT NO. : 5,630,469

DATED : May 20, 1997

INVENTOR(S) : Matthew A. Butterbaugh, Donald W. Dingfelder, Peter M. Herman, Sukhvinder S. Kang It is certified that error appears in the above-identified patent and that said Letters Patent is hereby corrected as shown below:

Claim 4, Col. 6, Line 25, "block" should be --blocked--.

Signed and Sealed this

Fifth Day of August, 1997

Attest:

BRUCE LEHMAN

Attesting Officer

Commissioner of Patents and Trademarks